US006969636B1

(12) United States Patent
Fritz

(10) Patent No.: US 6,969,636 B1
(45) Date of Patent: Nov. 29, 2005

(54) SEMICONDUCTOR PACKAGE WITH STRESS INHIBITING INTERMEDIATE MOUNTING SUBSTRATE

(75) Inventor: Donald S. Fritz, San Jose, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 10/797,408

(22) Filed: Mar. 9, 2004

Related U.S. Application Data

(62) Division of application No. 09/975,100, filed on Oct. 10, 2001, now Pat. No. 6,734,540.

(60) Provisional application No. 60/239,903, filed on Oct. 11, 2000.

(51) Int. Cl.[7] .............................................. H01L 21/44

(52) U.S. Cl. ...................................... 438/108; 438/126

(58) Field of Search ................................ 438/108, 126

(56) References Cited

U.S. PATENT DOCUMENTS 6,074,897 A * 6/2000 Degani et al. .............. 438/115
6,081,997 A * 7/2000 Chia et al. .................... 29/841
6,756,251 B2 * 6/2004 Lee ............................ 438/108

* cited by examiner

*Primary Examiner*—Luan Thai
(74) *Attorney, Agent, or Firm*—Morgan, Lewis & Bockius LLP

(57) ABSTRACT

A semiconductor package includes a chip carrier to receive a semiconductor with a dimension generally greater than 26 mm. The chip carrier has a first coefficient of thermal expansion that is larger than the coefficient of thermal expansion of the semiconductor. A stress inhibiting intermediate mounting substrate is connected to the chip carrier through a first array of solder connections. The stress inhibiting intermediate mounting substrate has a second coefficient of thermal expansion that is larger than the coefficient of thermal expansion of the chip carrier and smaller than or equal to the coefficient of thermal expansion of the printed circuit board. Alternate preferred inventive embodiments allow for the cleaning and removal of residual flux and other debris in packaging.

4 Claims, 4 Drawing Sheets

SEMICONDUCTOR PACKAGE WITH STRESS INHIBITING INTERMEDIATE MOUNTING SUBSTRATE

CROSS REFERENCE TO RELATED APPLICATIONS

The present application claims priority to and is a division of application Ser. No. 09/975,100, filed Oct. 10, 2001, now U.S. Pat. No. 6,734,540, which claims priority to U.S. Provisional application Ser. No. 60/239,903, filed Oct. 11, 2000.

BACKGROUND OF THE INVENTION

This invention relates generally to the packaging of semiconductor devices. More particularly, this invention relates to a large semiconductor device package that minimizes the impact of different coefficients of thermal expansion associated with the environment in which the package exists. The invention also relates to processing techniques employed for under-filling of chip dies to thin substrates which require rigid stiffeners to control the flatness of the device packages and reduce bowing affects due to internal stresses caused, for example, by differences in coefficients of thermal expansion between material layers.

DESCRIPTION OF THE RELATED ART

Integrated circuit geometry is becoming smaller, resulting in higher performance and functionality per unit area. While the chip circuitry is becoming more dense, the chip area is becoming larger and larger. Many of today's chips have hundreds, and even thousands of pads, that must be electrically connected to interface with a printed circuit board (PCB) containing other electrical elements and chips. It is important that the chip connections be designed in such a way as to allow for the chip pads to interconnect with the package.

As chips contain more functions that require a connection to the package, the bond pad area at the chip perimeter is beginning to exceed the capability of current technology to make connections from the chip to the package using traditional wire bond techniques. Wire connections from these pads to the package are limited by pad pitch and size. To overcome such limitations, the makers of integrated circuits are employing techniques to redistribute the pads to locations within the outer perimeters of chips, and converting the connection techniques from wire bonding to soldering the pads directly to the package. This technique is referred to as "flip chip" technology. While this technology has been in existence for many years, what is now unique to this technology is the shear magnitude of the die size and the number of interconnects. It is now possible to produce die sizes in excess of 35 mm square with thousands of interconnects.

The placement of semiconductor devices onto a substrate, or a printed circuit board, is generally referred to as the die placement, die attach or die bonding operation. Die placement techniques vary depending on the assembly process used. Variations in the technique can be due to a variety of design considerations, such as the particular application of the semiconductor package or the method necessary to interconnect the die within the package.

A common method of interconnecting the die within the package is wire bonding. In wire bonding, a wire is bonded both to the die circuitry and bonded to the substrate. In another method, the "flip chip" approach, a semiconductor die, referred to as a "bumped" die, includes patterns of contact bumps formed on a face of the die. The bumps are solder balls on the underside of the chip that are registered or aligned with solder pads on the substrate. The bumps allow the die to be mounted to a substrate and act as mechanical and electrical contact points with integrated circuit (ICs) formed on the die. The bumped device is mounted to the substrate active side down. Since the active circuitry is facing down instead of up, as in the case for wire bonded devices, this approach is known as "flip chip". This mounting process was originally developed by IBM and is also known as the C4 joining process (Controlled Collapse Chip Connection). In other structures, a silicon chip is embedded in the packaging where a top layer of bumps is not required.

Considering that the chip is in intimate contact with the package surface material, it is important that the chip surface and the package mounting surface have similar mechanical properties, so as to reduce the stress conditions between the chip and the package. Different package materials have different mechanical properties, such as different coefficients of thermal expansion, or "CTE". As the die size increases, the CTE between the chip and the package causes increased stress. If this stress increases above the modulus of the materials, there can be fatigue failure at the connection between the chip and the package.

In addition to the CTE differences between the chip and the package materials, there are other mechanical conditions to consider, such as the internal stresses of the package materials that cause bowing of the package. Extreme bowing can prevent the attachment of the die to the substrate, or the substrate to the printed circuit board.

Traditionally, small flip chips (less than 15 mm) have been mounted to single or multi-layer organic substrates, similar to printed circuit boards. Since the CTE of the chip is low (i.e., less than 3 parts per million (PPM)), and the CTE of an organic substrate is high (i.e., in the range of 14 to 17 PPM), a large die (e.g., greater than 26 mm) mounted directly to this type of substrate would be under a very high stress during certain temperature cycles. Ideally, a package must perform over a temperature range of greater than 100 degrees Celsius. For a temperature range of this type, the joint of a soldered connection between the chip and the substrate will fail due to thermal fatigue in less than 500 temperature cycles.

To improve the mechanical performance between a chip and a printed circuit board, glass, ceramic and glass-ceramic mounting layers have been used. These materials, generally referred to as glass-ceramic materials, have coefficients of thermal expansion in the range between 3 and 7 PPM (parts per million) and therefore more closely match the CTE of the semiconductor. This match in CTE lowers the chip-to-substrate stress and allows the chip connection to maintain a bond during temperature cycling. However, this approach results in a secondary problem when the package is mounted to a printed circuit board with a CTE greater than the glass-ceramic CTE. The problem of early temperature cycling failure is now transferred from the die-to-package interface, to the package-to-board interface. Some manufacturers have overcome this secondary problem by employing what is know as "column grid array" connections, but this technique does not lend itself to more conventional socket and board mounting requirements.

Metal alloys (e.g., a lead tin alloy for example) can be used to form the bumps. Typically, the bumps are dome shaped, and have an average diameter of from 5 mils to 30 mils or greater. Micro ball grid arrays (BGA) are formed in the smaller range, while standard ball grid arrays are formed in the larger size range. The sides of the bumps typically bow or curve outwardly from flat top surfaces. The flat top surfaces of the bumps form the actual regions of contact with the mating contacts on the substrate.

Referring to FIGS. 1–3, a semiconductor die or flip chip 20 is provided with a pattern of solder bumps 22 on an underside or circuit side of the chip. The solder balls 22 align with solder pads 24 on a PC board or similar substrate 26. Flux is normally applied between the solder balls 22 and solder pads 24. Upon heating, the solder pads 24 on the substrate 26 reflow and physically connect with the solder balls 22 on the underside of the chip 20. High lead solder balls 22 typically have a high melting point and therefore do not reflow; eutectic solder balls would melt and slightly collapse and reflow onto the printed circuit board pads. This connection is illustrated in FIG. 2 by deformed solder pad 24' mating with a solder ball 22. This process eliminates the requirement for wire bonding.

Special liquid epoxy 28 (FIG. 3) is typically used to completely fill the underside of the chip. This is referred to herein as the "underfill" operation. Upon curing, the resulting encapsulation forms a barrier to prevent moisture from contacting and thus corroding the electrical interconnects between the substrate 26 and the chip 20. The epoxy 28 also serves to protect the bonds between the deformed solder pads 24' and the solder balls 22 by providing thermal stress relief, i.e., accommodating different rates of thermal expansion and contraction. Underfills are often plastic-based materials that flow into small spaces to fill a gap or void 30 between the component (or die) and the substrate to which it is mounted.

Particularly for the large dies over 26 mm, direct access to areas under a chip and removal of residual flux thereunder is restricted. Prior approaches for package construction do not allow effective methods of removing residual flux and other foreign material and objects between the package construction materials that can adversely affect overall packaging performance. Additionally, prior approaches do not allow for an effective method for applying under-fill to uniformly fill between large dies or constructions of a large area package so as to provide more optimal mechanical and thermal performance of the packaging.

In view of the foregoing, it would be highly desirable to provide an improved technique for mounting large semiconductor devices so as to minimize the impact of environmental mismatches in coefficients of thermal expansion. A need exists for a method of construction that allows for a large die to be reliably mounted to a thin package while maintaining the flatness of the substrate, particularly over a large area. In addition, need exists for a process technique for under-filling a flip-chip die to substrates to control the flatness of packages and reduce mechanical and thermal stresses. A need also exists for a method of allowing uniform under-filling of a die-substrate interface. Moreover, a need exists for a method of packaging integrated circuits that can be reliably connected to a motherboard containing other electrical circuits. Further, a need exists for package construction methods that permits effective removal of residual flux and other foreign material and objects between the package construction materials that can adversely affect device performance.

SUMMARY OF THE INVENTION

The invention relates to methods of package construction that allow for a first part assembled to a second part having a dissimilar coefficient of expansion. A semiconductor package includes a chip carrier to receive a large semiconductor. The chip carrier has a first coefficient of thermal expansion that is different from the coefficient of thermal expansion of the semiconductor. A stress inhibiting intermediate mounting substrate is connected to the chip carrier through a first array of solder connections. The stress inhibiting intermediate mounting substrate is adapted for connection to a printed circuit board through a second array of solder connections. The stress inhibiting intermediate mounting substrate has a second coefficient of thermal expansion that is larger than the coefficient of thermal expansion of the chip carrier and smaller than the coefficient of thermal expansion of the printed circuit board. The invention disclosed includes a method of mounting together multiple constructions using under-fill material to absorb the stresses in a package construction having materials with different CTE's, particularly over a large area. In addition, the invention also relates to an effective system and method for removal of residual flux and other foreign material and objects between the package construction materials.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 1:
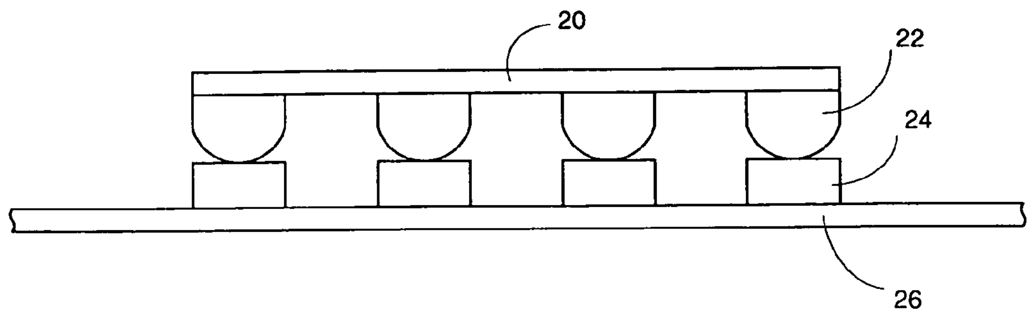
FIG. 1 is a cross sectional view showing a flip chip and substrate prior to a reflow in accordance with the prior art.
Figure 2:
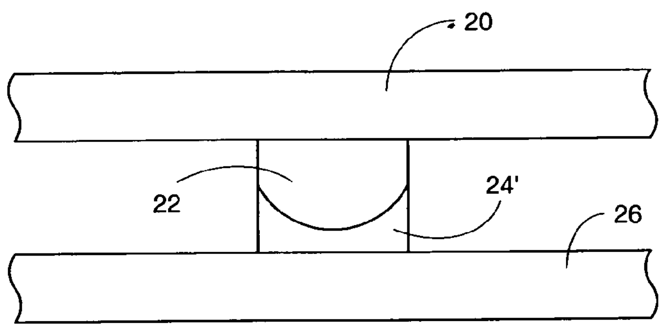
FIG. 2 is an enlarged view of a solder pad deformed after reflow in accordance with the prior art.
Figure 3:
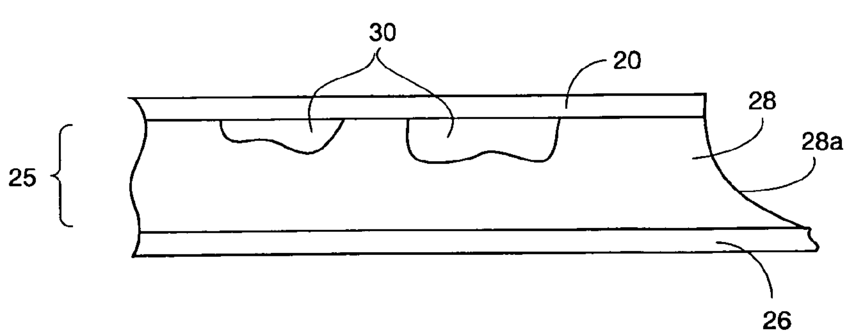
FIG. 3 is an cross sectional view of the chip and substrate of FIG. 1 after an under-filling operation where voids are shown remaining between the chip and substrate.
Figure 4:
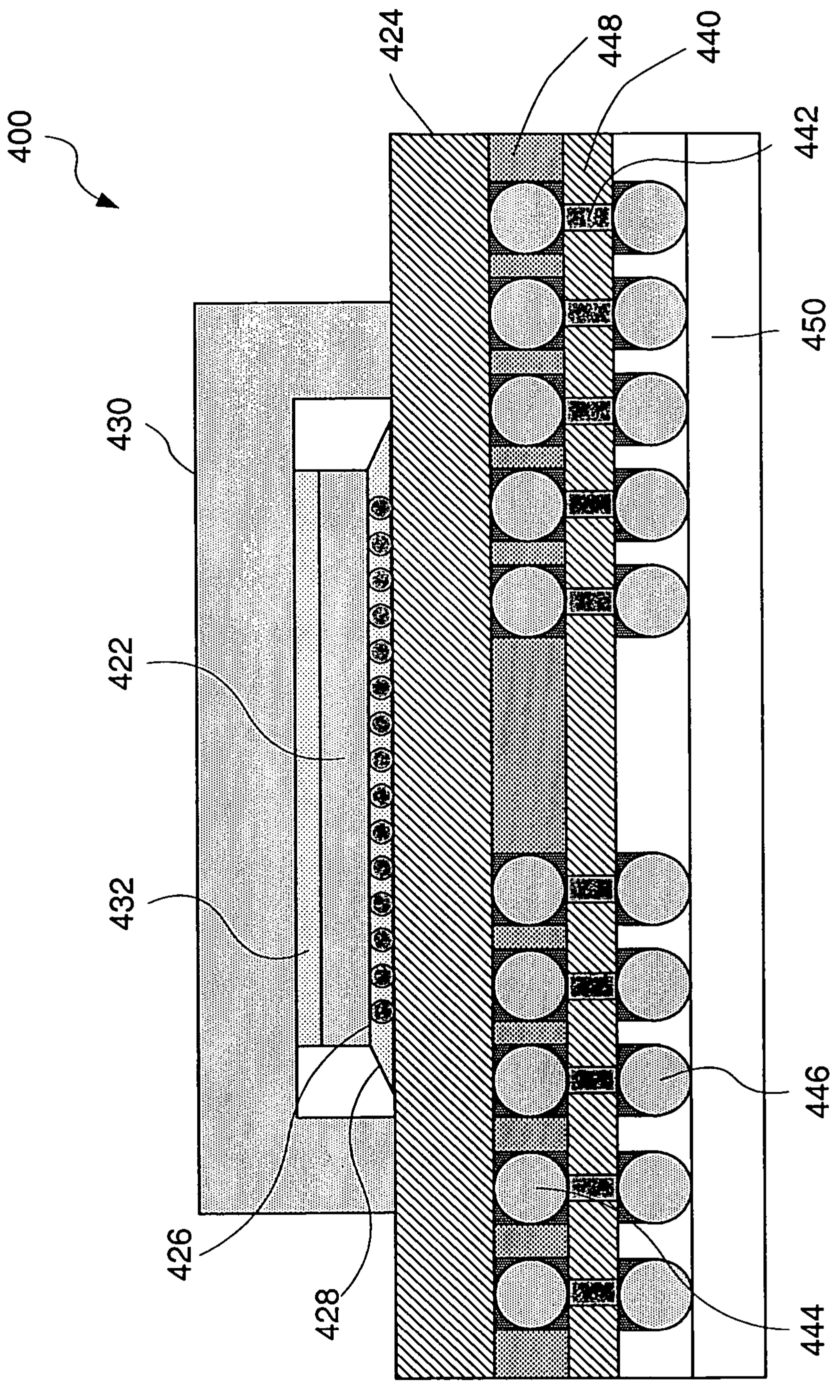
FIG. 4 illustrates a semiconductor package with a stress inhibiting intermediate mounting substrate in accordance with an embodiment of the invention.

FIG. 4 illustrates a semiconductor package 400 with a stress inhibiting intermediate mounting substrate in accordance with an embodiment of the invention. The package 400 houses a large semiconductor 422 (i.e., a semiconductor with a dimension typically larger than 26 mm). The semiconductor 422 is mounted on a prior art ceramic chip carrier 424. As used herein, the term ceramic material or ceramic chip carrier refers to a glass, ceramic, or glass-ceramic chip carrier with a CTE of between approximately 3 and 7 PPM. Solder bumps 426 interface the semiconductor 422 to the ceramic chip carrier 424, which includes internal traces to connecting the top surface of the chip carrier to the bottom surface of the chip carrier. Preferably, under-fill resin 428 is positioned between the semiconductor 422, the ceramic chip carrier 424, the solder bumps 426.

A package lid 430 is preferably used with the package 400. A thermal compound 432 (e.g., a thermal grease) is preferably used between the semiconductor 422 and the package lid 430.

In the prior art, elements 422–432 are used to establish a direct mount to a printed circuit board. In accordance with the present invention, a stress inhibiting intermediate mounting substrate 440 is used between a printed circuit board 450 and the ceramic chip carrier 424. The stress inhibiting intermediate mounting substrate 440 is formed from a material with a CTE of between 14–18 PPM, preferably approximately 16–18 PPM. The stress inhibiting intermediate mounting substrate 440 includes electrical paths 442 between the top and bottom surfaces of the substrate 440.

Top layer solder balls 444 are used to establish electrical connections with the ceramic chip carrier 424. Bottom layer solder balls 446 are used to establish electrical connections with the printed circuit board mounting substrate 450, which preferably has a CTE of between 14 and 17 PPM. Ideally, under-fill resin 448 is used between the glass-ceramic chip carrier 424 and the stress inhibiting intermediate mounting substrate 440, but not between the stress inhibiting intermediate mounting substrate 440 and the printed circuit board 450. This allows for the package 420 of the invention to be used in connection with standard, non-proprietary mounting substrates 450. In preferred embodiments of the invention, lead-free solder is used for solder balls, particularly for the solder balls 444 on the interposer between a ceramic substrate and the interposer, and, preferably, either no lead balls or eutectic solder balls are used for mounting to the printed circuit board.

A preferred embodiment of the invention would be a construction wherein the solder balls on the die are made from an alloy which has the highest melting temperature solder of the total package, such as high lead or no lead solder. The solder balls used for the connection between the ceramic package and the interposer should have a melting temperature equal to or lower than the solder used for the die solder balls, and finally, the solder balls used to connect the interposer to the printed circuit board should have a melting temperture the same as the solder balls used to attach the ceramic substrate and the interposer, or a lower melting temperature such a lead tin eutectic.

The mounting substrate 440 of the invention provides a transition interface to reduce stress associated with mismatches in coefficients of thermal expansion. In particular, the invention operates as a stress inhibiting intermediate mounting substrate between a printed circuit board with a large CTE and a semiconductor device with a small CTE, but particularly for a large device size of greater than 26 mm. The package 400 of the invention may utilize a prior art chip carrier 424 with a small intermediate CTE. In addition, the package utilizes a stress inhibiting intermediate mounting substrate 440 with a large intermediate CTE. Thus, the package of the invention provides for mechanical stress alleviation through a stacked structure with different coefficients of thermal expansion.

Figure 5:
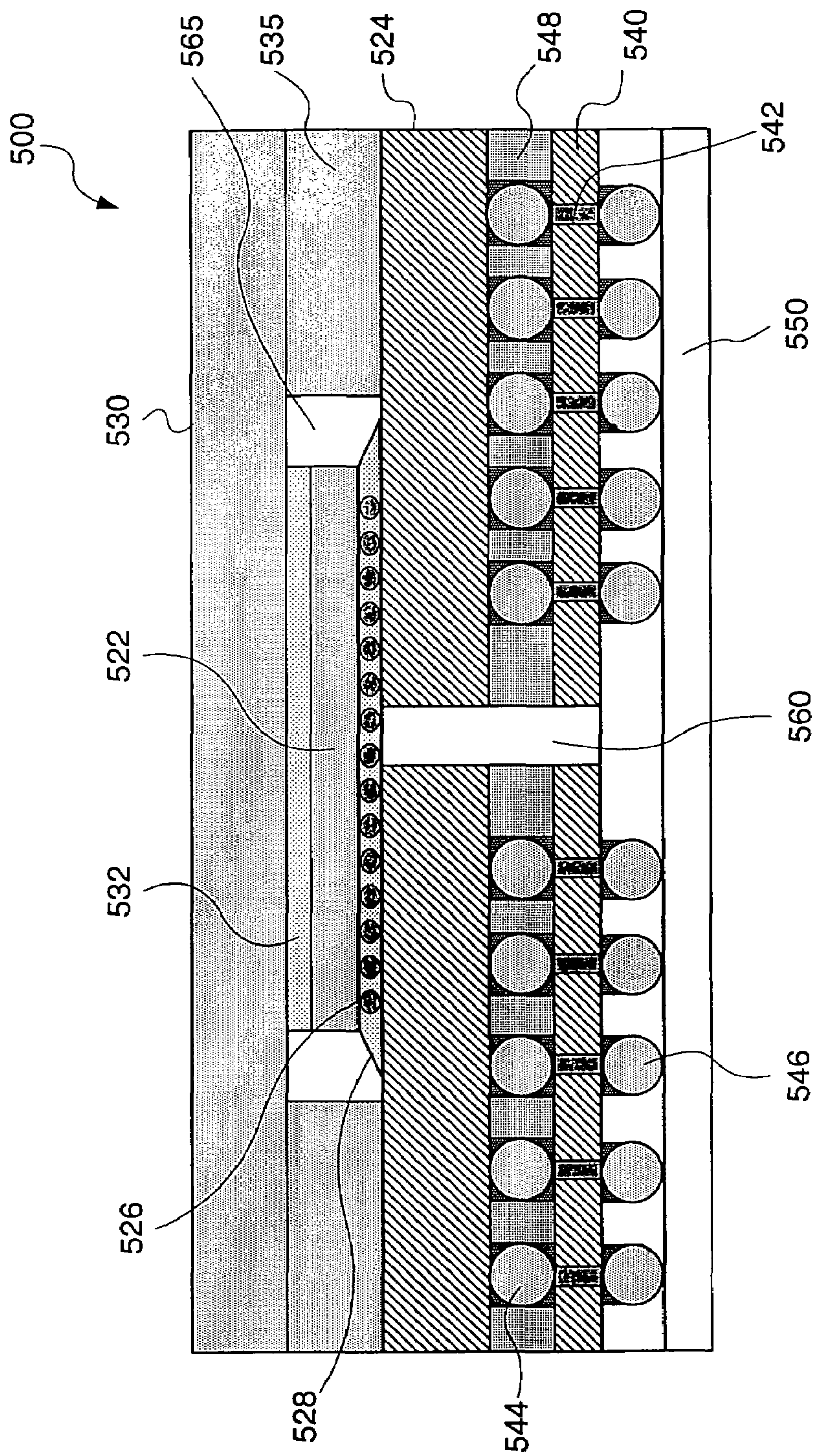
FIG. 5 illustrates an interposer with balls removed from each corner and a hole in the center of the interposer to allow for the insertion of an apparatus.

Additionally, the present invention comprises enhancements to the package assembly to allow for under-filling of the die to substrate interface. As illustrated in FIG. 5, a preferred embodiment of semiconductor package 500 includes a clearance channel 560. The package 500 houses a semiconductor 522. The semiconductor 522 is mounted on chip carrier 524. Solder bumps 526 interface the semiconductor 522 to the chip carrier 524, which includes internal traces to connecting the top surface of the chip carrier to the bottom surface of the chip carrier. Preferably, under-fill resin 528 is positioned between the semiconductor 522, the chip carrier 524, the solder bumps 526. Other elements of FIG. 5 correspond to similar preferred elements of FIG. 4 when the reference numbers differ by 100.

Flux residue can cause defects such as voids and delamination when flip chip is under-filled. Defects are generally magnified with the size of the die and device applications requiring finer pitches. Cleaning and removing flux residue also becomes more difficult with the increase in die size and reduction of bump pitch. Failure to properly remove residue may contribute to device degradation in terms of reliability, durability and performance due to leakage and the existence of voids in the under-fill. With the trend toward large die areas, conventional methods, such as brushing or dipping, are not as applicable as such conventional methods are highly inefficient and not practical for high volume applications. However, in a preferred embodiment, the clearance channel 560 allows for the insertion of an apparatus to be used for cleaning out or otherwise removing any residual flux or foreign material, for applying under-fill material directly to an assembled package and interposer and for general access to a central region of the package.

An interposer, which also generally refers to the substrate 540, may be a print circuit board with wiring on both sides and where electrical connections can be made through holes located on the board. The interposer electrically connects the terminals of semiconductor chips placed on top of the device packages and printed circuit boards. It is generally preferred that wiring of interposer is designed with as short wiring distances as possible while absorbing the thermal stress that is generated between the chip and the substrate during use.

In a preferred embodiment, the hole or channel 560 is located at the center of the interposer or in a region providing access to the center of the assembled package. The location of the channel at the center of the interposer generally reduces the average distance that under-fill material must travel to completely fill spaces and voids between the interposer and the package. For example, in a conventional 40 mm package having under-fill material to the package edge, as is generally the case, the under-fill material must travel a distance of 40 mm to completely fill in and cover the appropriate surface. By applying the under-fill in the center region of the package, this total distance for this example is reduced to about 28 mm. This reduction in total distance allows for a more uniform spreading of under-fill material. The reduction in total distance also allows for superior under-fill spreading for under-fill materials that have a high viscosity and/or materials that have slow flow characteristics.

The same techniques described above for package construction can also apply in package construction where a flexible thin substrate is used where a rigid stiffener is mounted to maintain the flatness of the substrate. For example, a stiffener 535 may be mounted on the substrate 524 to provide structural rigidity to package construction, particularly for cases where the substrate is designed to be thin or requires additional support.

Figure 6:
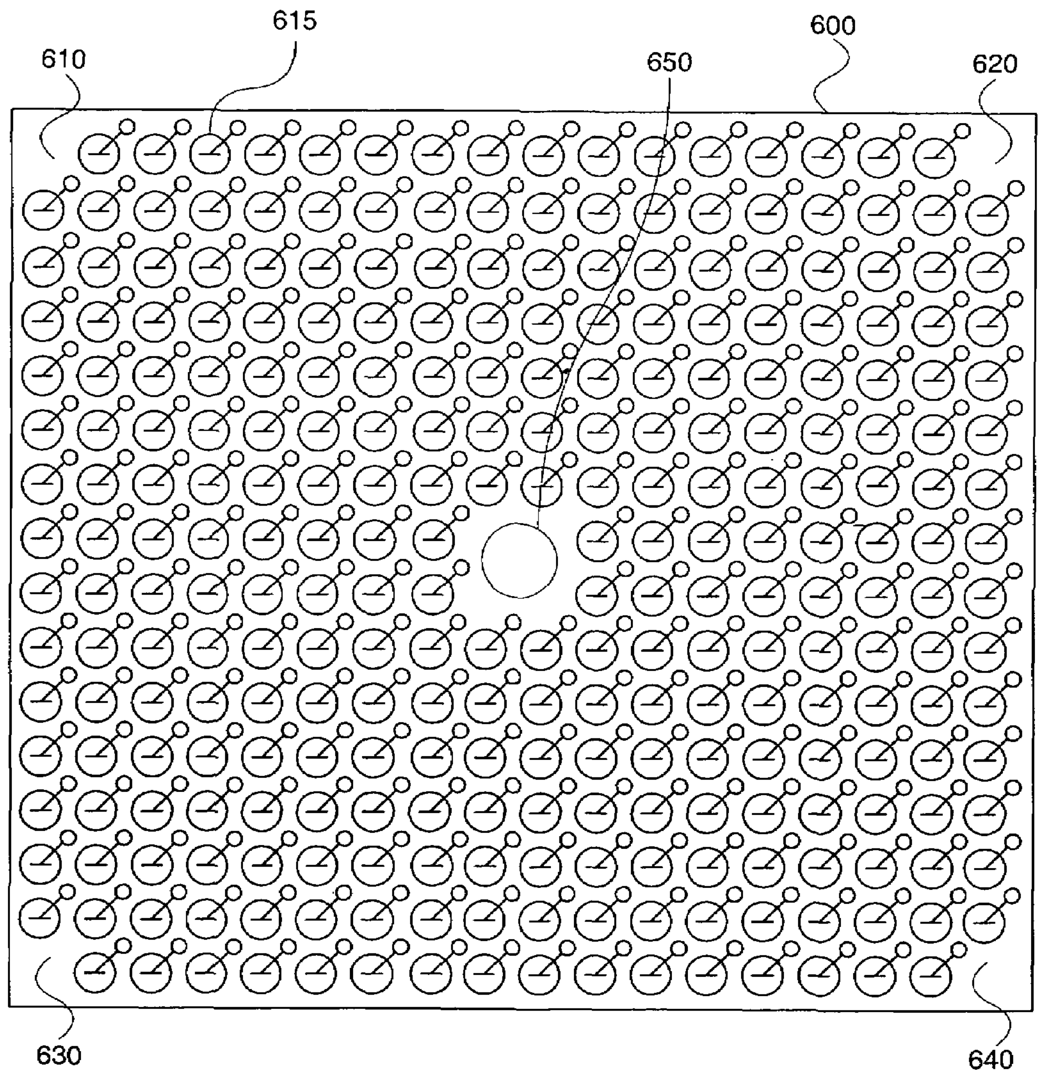
FIG. 6 illustrates an interposer with a clearance hole in accordance with an embodiment of the invention.

In FIG. 6, an preferred interposer 600 is illustrated. Interposer 600 preferably is a printed circuit board consisting of an array of pre-wired channels. As described below, the interposer has a hole preferably located in the center region 650 as shown. The interposer can be used, for example, in the package 500 as a substrate for receiving a chip assembly. Selected solder balls are deleted from the package, and an access channel 560 is provided through the interposer to allow for cleaning of residual flux from beneath a die or chip 522 and subsequently to insert under-fill material directly to the center of the die. In an alternate preferred embodiment, and particularly when the die is large, the stiffener 535 usually needs to maintain a maximum dimension. The combination of a large die and large stiffener result in a minimal space at gap 565. As an example, it is not atypical that a 26 mm by 32 mm die mounted to a 40 mm package would require a 2 to 3 mm space at gap 565 to allow for under-filling at the die edge. By under-filling directly beneath the die, this space can be significantly reduced.

Additionally, an alternate preferred embodiment of the interposer does not include solder connection holes, such as a solder hole 615, in one or more locations of the interposer. The absence of such solder connection holes provides several advantages, including, without limitation, superior overall rigidity in for the interposer and the reduction in the total distance that under-fill must flow. In a preferred embodiment, the removed or absent solder connections are located at or near one or more corners 610, 620, 630 and/or 640.

The construction package and techniques of the invention provides for mechanical stress alleviation through a stacked structure with different coefficients of thermal expansion. The inventions disclosed herein provide for methods of package construction that allow for the packaging of a first part assembled to a structure of a second part having dissimilar CTE characteristics. The final package assembly can then be mounted to a motherboard or similar construction that has a CTE which closely matches the CTE of the second part. The methods disclosed herein may apply to dies of various sizes, including dies having a form factor that is large in comparison to the overall substrate size. Alternate preferred embodiments of the present invention also allow for the cleaning and removal of residual flux and other material in packaging. Additionally, alternate preferred embodiments permit superior and more uniform under-fill below a die. While each of the embodiments apply to various die sizes and shapes, the advantages of the invention disclosed herein are more pronounced for large die sizes and shapes.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. For example, the inventions disclosed may apply to, or be configured for, flip chip, ball grid array and column grid array and other applications. The disclosure is not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A method of underfilling a gap between a multi-sided semiconductor device and a chip carrier on which it is mounted to encapsulate a plurality of electrical connections formed therebetween wherein said chip carrier is mounted on an intermediate mounting substrate and the intermediate mounting substrate is adapted for connection to a printed circuit board, comprising forming a channel extending through said intermediate mounting substrate and said chip carrier to said gap; and dispensing through said channel an under-fill material into said gap, said intermediate mounting substrate having a coefficient of thermal expansion different from a coefficient of thermal expansion of the chip carrier and smaller than a coefficient of thermal expansion of the printed circuit board.

2. The method of claim 1 wherein said channel permits the removal of residual flux.

3. The method of claim 1 wherein the chip carrier has a first coefficient of thermal expansion different from a coefficient of thermal expansion of the semiconductor device.

4. The method of claim 1 wherein the chip carrier has a first coefficient of thermal expansion different from a coefficient of thermal expansion of the intermediate mounting substrate.

* * * * *